United States Patent [19]
Kanata

[11] Patent Number: 5,667,923
[45] Date of Patent: Sep. 16, 1997

[54] CHARGED PARTICLE BEAM EXPOSURE COMPENSATING PROXIMITY EFFECT

[75] Inventor: Hiroyuki Kanata, Kawasaki, Japan

[73] Assignee: Fujitsu Limited, Kawasaki, Japan

[21] Appl. No.: 638,864

[22] Filed: Apr. 29, 1996

Related U.S. Application Data

[63] Continuation of Ser. No. 301,565, Sep. 7, 1994, abandoned.

[30] Foreign Application Priority Data

Sep. 8, 1993 [JP] Japan ................................ 5-222916

[51] Int. Cl.$^6$ ........................................ G03F 7/20
[52] U.S. Cl. ................ 430/30; 430/296; 430/942; 250/492.3
[58] Field of Search ................. 430/30, 296, 942; 250/492.3

[56] References Cited

U.S. PATENT DOCUMENTS

| | | | |
|---|---|---|---|
| 4,500,789 | 2/1985 | Ban | 430/296 |
| 5,278,419 | 1/1994 | Takahashi | 250/492.2 |

*Primary Examiner*—Kathleen Duda
*Attorney, Agent, or Firm*—Armstrong, Westerman, Hattori, McLeland & Naughton

[57] ABSTRACT

A subject pattern and a lower layer pattern are divided into small regions of a constant dimension using identical mesh of division. Considering of the spreading of charged particle beam due to backward scattering, the small region is set to be, for example, a few μm square. An irradiation energy on each small region is determined by taking backward scattering from lower level pattern into account. Calculation is simplified because a pattern is represented by a pattern areal density. A region with a lower level pattern and a region without a lower level pattern can be exposed by charged particle beam with a comparable accuracy.

4 Claims, 11 Drawing Sheets

CHARGED PARTICLE BEAM EXPOSURE COMPENSATING PROXIMITY EFFECT

This application is a continuation of application Ser. No. 08/301,565 filed Sep. 7, 1994, now abandoned.

BACKGROUND OF THE INVENTION a) Field of the Invention

The present invention relates to a charged particle beam exposure method, and more particularly, to a charged particle beam exposure method which can be compensate proximity effect.

b) Description of the Related Art

In a charged particle beam exposure, charged particles are injected to a resist film to expose the resist film. Charged particles incident on the resist film undergo multiple scattering as they proceed.

In a case wherein a resist film is formed on a silicon substrate and a charged particle beam exposure is performed thereon, the charged particles incident on the resist film are subjected to forward scattering as they proceed within the resist film, and proceed to the silicon substrate. The charged particles which have reached the substrate may proceed from the substrate to the resist film again by large angle scattering (backward scattering) in the substrate.

An exposure pattern will have a parasitic pattern formed around a designed exposure pattern due to such forward scattering and backward scattering as mentioned above. When the exposure patterns are densely located, parasitic patterns due to scattering around each of the pattern are superposed so that an intensity of exposure outside the exposure patterns may exceed a threshold level of development.

As a result, there occurs such phenomenon that patterns having a larger size than a designed size are obtained. This phenomenon is called a proximity effect since it is remarkable when the patterns to be exposed are densely located in proximity to one another.

Figure 6A:
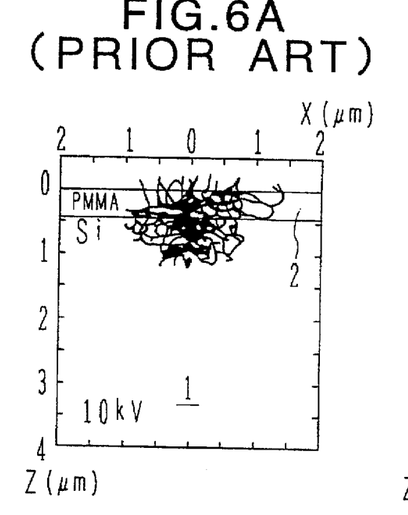
FIGS. 6A to 6D are a graphs showing state of spreading of charged particle beam in a resist film and a substrate, a diagram showing a superposition of scattering intensities of charged particle beam which exposes separate patterns, and a diagram showing designed pattern and exposed pattern with a deterioration of resolution by proximity effect.
Figure 6B:
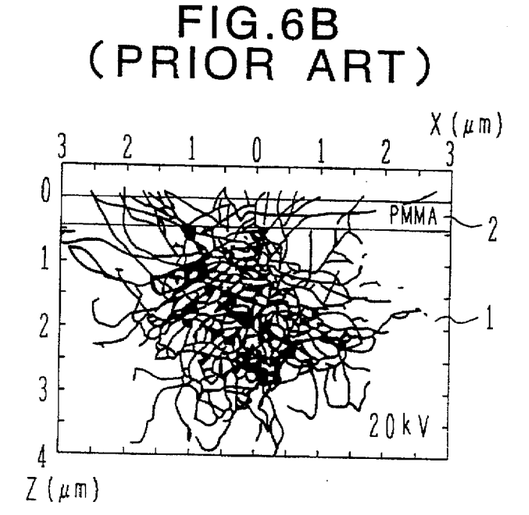
Figure 6C:
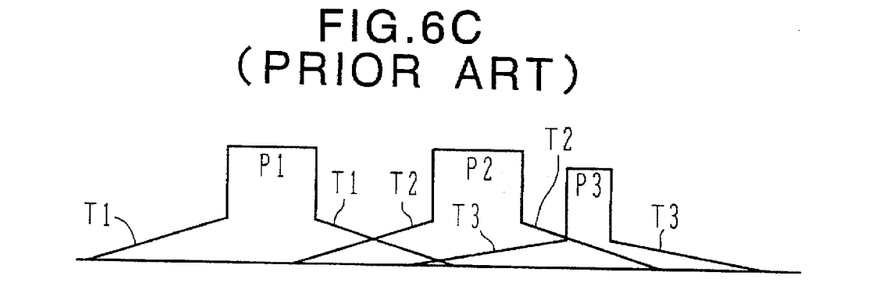

FIGS. 6A, 6B and 6C are diagrams for illustrating the proximity effect. FIGS. 6A and 6B are graphs showing trajectories of electrons when a resist film 2 formed of PMMA is disposed on a silicon substrate 1 and electron beam is irradiated thereon from upward. FIG. 6A shows trajectories of electrons when they are irradiated with an acceleration energy of 10 kV, and FIG. 6B shows trajectories for a case with an acceleration energy of 20 kV.

Each of the graphs of FIGS. 6A and 6B is derived from a simulation by Monte Carlo method of trajectories of 100 electrons. Abscissae of the graphs refer to a distance of the resist film 2 from an irradiating position of electrons in micron, and ordinates of the graphs refer to a depth from the surface of the resist film 2 in micron.

As is apparent from the graphs, electrons irradiated on the resist film 2 reach, because of forward scattering and backward scattering, to a depth of about 2 μm in a case in which acceleration voltage is 10 kV, and about 4 μm in a case in which acceleration voltage is 20 kV.

FIG. 6C is a diagram showing schematically a distribution of exposure intensity due to such electron beam exposure. The intensity is strong at portions of exposure patterns P1, P2, and P3. Tail portions T1, T2, and T3 are formed therearound by forward scattering and backward scattering. The intensity at the tail portion depends on an area of the pattern. It is strong when the pattern is wide and is weak when the pattern is narrow.

2

With a given acceleration energy of the charged particle beam, extension of tail portion T due to scattering will be approximately constant. The intensity of the tail portion which extends around each pattern reduces as a distance from the pattern increases.

Here, the tail portions T1 and T2 of the patterns P1 and P2, respectively, as shown in the figure, are superposed mutually in the intermediate region, giving a sum effect on the resist film. Thus, at portions with dense patterns, tails from each pattern are superposed, and, thereby, may exceed a threshold value of development.

Figure 6D:
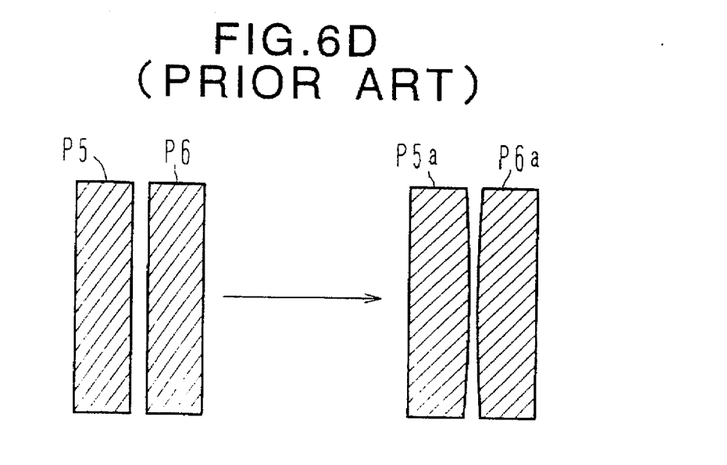

FIG. 6D is a diagram to illustrate a proximity effect caused by a superposition of tail portions which originate from forward scattering and backward scattering. In a case of exposing rectangular patterns P5 and P6 positioned in parallel, as shown on the left hand side of FIG. 6D, when a charged particle beam exposure is performed on the exposure patterns which are designed according to desired patterns, resulting patterns of the exposure will become as shown on the right hand side of FIG. 6D.

Namely, at a central part of a gap between the patterns P5 and P6, tail portions of each part of the patterns superpose thickly, thereby, to thicken an exposed width of the patterns than designed. Thus a desired shape of pattern cannot be obtained when a proximity effect occurs.

Means for obtaining a desired shape of pattern by compensating proximity effect beforehand is called a proximity effect correction. FIGS. 7A to 7D show diagrams illustrating prior art techniques of compensating proximity effect.

Figure 7A:
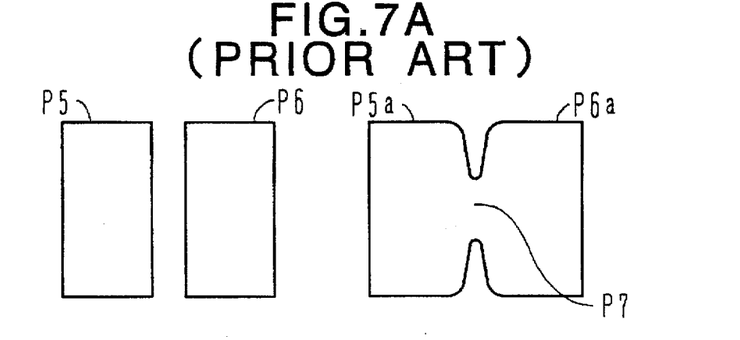
FIG. 7A shows poximity effect without compensation.

FIG. 7A shows schematically a case wherein no compensation of proximity effect is given and a proximity effect is generated between two subject patterns. When rectangular patterns P5 and P6 are exposed, the patterns would have an thickened portions at their centers and patterns P5a and P6a with thickened portions may be connected at the central portion P7. Methods for compensating such proximity effect are described hereunder.

Figure 7B:
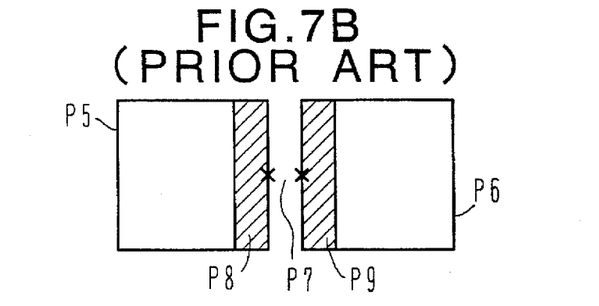
FIG. 7B shows an exposure intensity adjusting method.

FIG. 7B shows a method of compensating proximity effect by changing an irradiation intensity of charged particle beam. In exposing the patterns P5 and P6, proximity effect as shown in FIG. 7A occurs, if the whole area within the patterns is exposured with a uniform intensity.

To compensate the proximity effect, irradiation intensity is reduced at portions in the vicinity of other patterns. For example, as shown in the diagram, sampling point X is taken at a center of each side of the patterns P5 and P6 facing to each other. An amount of irradiation of charged particle beam including effect of scattering from patterns in the vicinity is calculated at each of the sampling points. The amount of irradiation on the adjacent portions P8 and P9 is adjusted to obtain a pre-determined exposure amount.

By reducing the amount of irradiation of charged particle beam on the adjacent portions P8 and P9, scattering of the charged particle beam at a region P7 between the patterns is reduced, and the proximity effect is compensated.

Figure 7C:
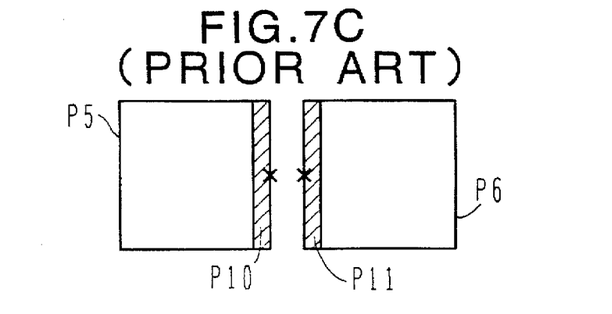
FIG. 7C shows a pattern eliminating method.

FIG. 7C is a diagram for illustrating a pattern elimination method, which is another method of compensating proximity effect. When patterns P5 and P6 are exposured as designed, each pattern becomes larger than the designed size. Thus, a portion of the pattern is curtailed in advance to incorporate the pattern size increment by scattering, thereby obtaining a pre-determined size of resultant exposure pattern.

For example, a sampling point X is taken at each center of side of the patterns P5 and P6 facing to each other. An amount of irradiation of charged particle beam including effect of scattering from patterns in the vicinity thereof is calculated at each of the sampling points. A portion of each of the adjacent regions P10 and P11 is curtailed. Thus, exposed patterns will form patterns P5 and P6 which have desired widths in stead of wider patterns without compensation.

However, since both of the pattern elimination method and the irradiation intensity reducing method need compensation calculation for all the patterns to be exposed, a time required for performing compensation calculations increases drastically as the number of patterns increases. Further, since both of the compensation require representative points for obtaining compensation value of exposure intensity thereat. If the number of representative points is not enough, it becomes impossible to fully compensate distortions due to proximity effect. A larger number of representative points will cause an increase of the time of compensation calculation.

Moreover, for a block exposure method which copies a repetition of complex patterns formed on a mask collectively, the pattern eliminating method and the irradiation intensity adjusting method, which compensate for each of the patterns, are extremely difficult to perform, practically.

Figure 7D:
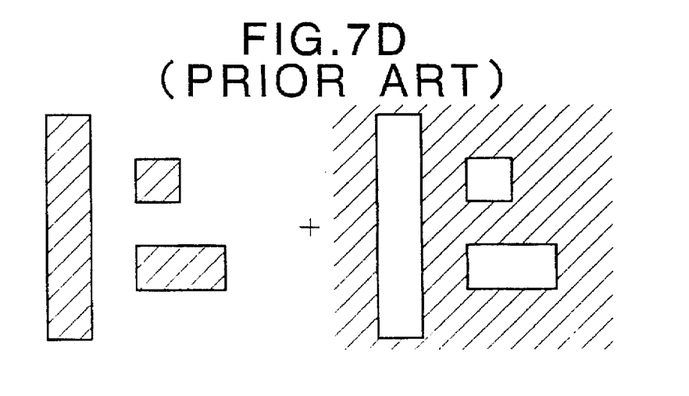
FIG. 7D shows a ghost exposure method.

FIG. 7D shows a ghost exposure method which is another method of compensating proximity effect. The ghost exposure method uses a main pattern and a supplementary pattern which is a reversal pattern of black and white of the main pattern for forming an exposure pattern.

After an exposure using the main pattern, an exposure using the supplementary pattern is performed with an intensity corresponding to an intensity of backward scattering. Such an additional exposure will provide a uniform exposure outside of the main pattern, and development of only the main pattern can be provided by adjusting the level of development.

The ghost exposure solves problems of insufficient compensation of proximity effect and increase of time for compensation calculation of proximity effect. However, it is necessary to form a reversal pattern of the main pattern, and, further, exposure time is elongated by an exposure of a complicated reversal pattern.

These methods of compensating proximity effect premise that, in determining conditions of exposure, a substrate to be exposed is formed of a uniform material.

In such a uniform material, spreading of an incident electron beam due to forward scattering and backward scattering can be approximated as:

$$F(r)=\exp(-r^2/A^2)+B\exp(-r^2/C^2) \quad (1),$$

where the first term on the right hand side represents forward scattering, and the second term represents backward scattering. In the formula (1), the normalization constant is neglected. A parameter B represents an intensity ratio of the backward scattering with respect to the forward scattering. Parameters A and C represent extension of Gaussian distribution of electron beam due to scattering. And r denotes a distance from a point of irradiation of the electron beam.

If exposure of a substrate is to be done taking various patterns into consideration without premising a uniform material, the constants B and C in the formula (1) have to be considered as a function of location. Then, the number of data, as of exposure data, to be taken into account at the time of calculation increases extremely so that a very long time would be needed in treatment. Consequently, lower level patterns which could have been formed on the lower level of the substrate has not been considered heretofore.

Practical substrates have often experienced with various semiconductor processes, and thus have various thin-layers as of $SiO_2$, $Si_3N_4$, Al, Ti, W, or the like formed thereon. Such substrates are far from being uniform. However, for exposing a resist layer on such a substrate formed of various thin layers, conditions of exposure have not been determined upon considering each underlying layer, but have been determined, for convenience sake, with a premise that the substrate is formed of a material of uniform quality. Thus, due to non-uniformity of an intensity of backward scattering, there occurred cases that proximity effect may have been compensated sufficiently at some portions but may not have been compensated sufficiently at other portions. In particular, when a wiring of a material having a large atomic number such as tungsten, which has a large cross section of scattering for electrons, is patterned underneath, backward scattering intensity at a portion covering the wiring becomes abnormally large compared to other portions. Accordingly, only at this portion, proximity effect cannot be compensated sufficiently, thereby producing resolution defects thereat.

Figure 8A:
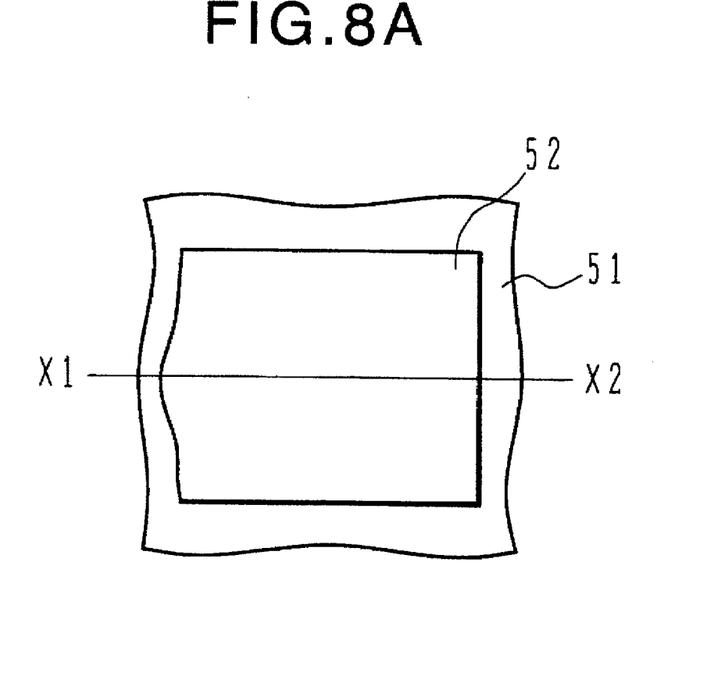
FIGS. 8A, 8B, 9A, 9B, 10A, and 10B show charged particle beam exposure according to prior art technique.
Figure 8B:
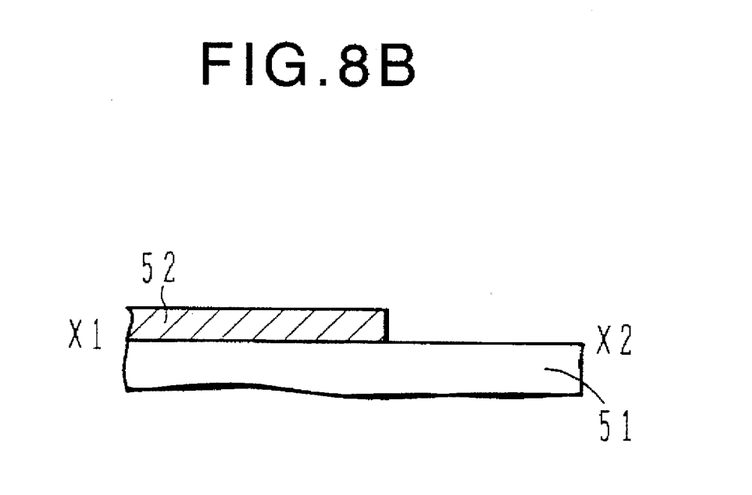
Figure 9A:
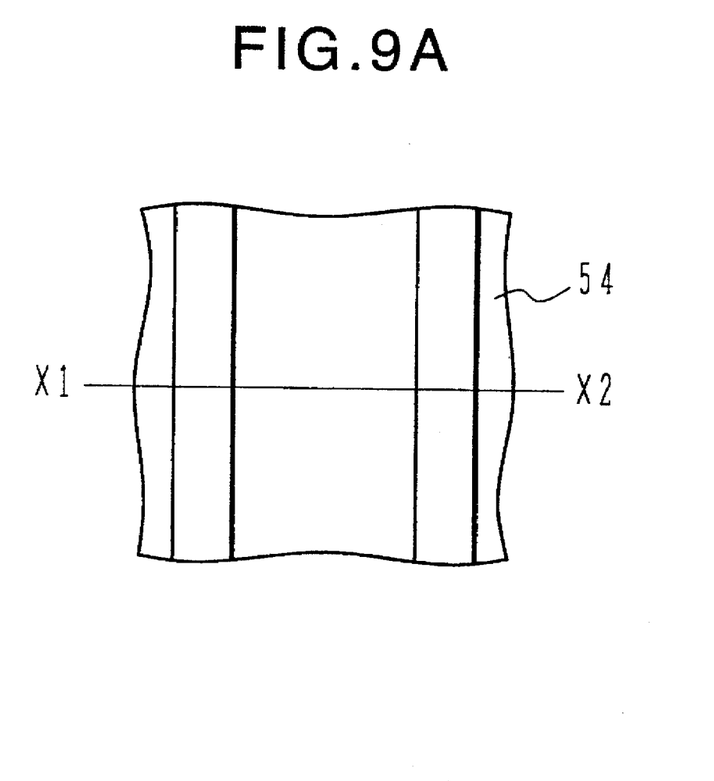
Figure 9B:
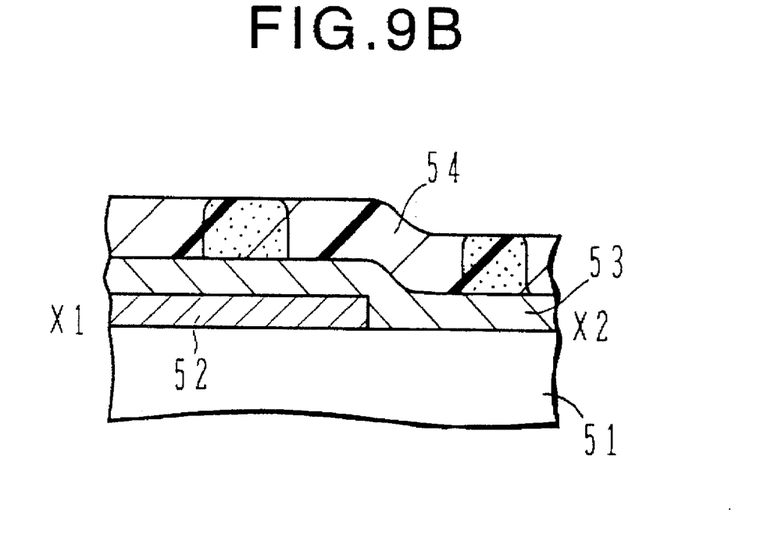
Figure 10A:
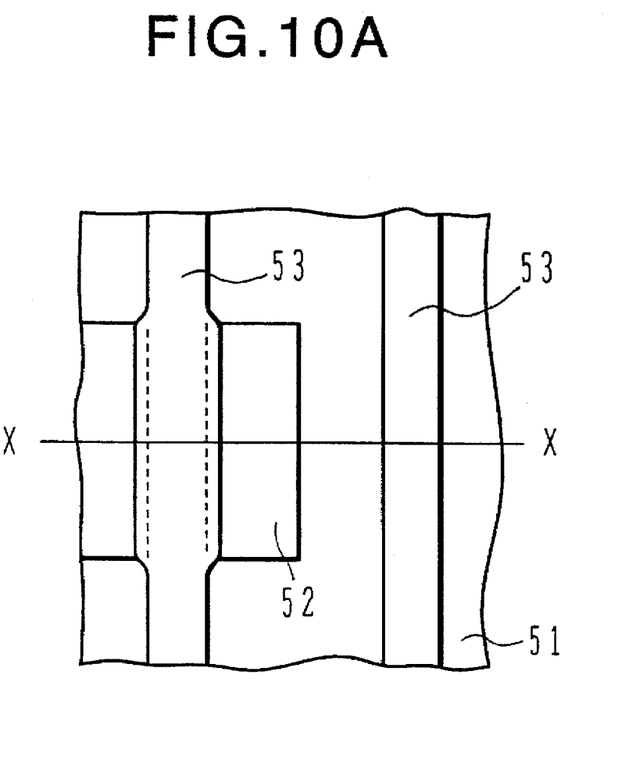
Figure 10B:
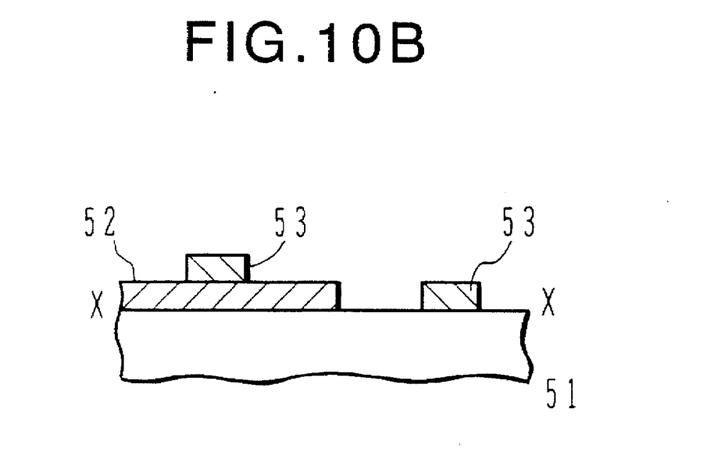

FIGS. 8A, 8B, 9A, 9B, 10A, and 10B show a case of selective exposure on a resist film covering a lower level tungsten pattern. In FIGS. 8A and 8B, a lower level pattern 52 of W is formed. In FIGS. 9A and 9B, an upper level layer 53 is deposited on the lower level pattern, and a resist film 54 is applied on the upper level layer 53. Charged particle beam is irradiated on the resist film 54 according to a data of upper level patterns to expose the resist film 54. FIGS. 10A and 10B show a resultant substrate. First, the resist film 54 is developed. The upper level layer 53 is etched using the developed resist film 54 as a mask. Then, the resist film 54 is removed. At a portion where the upper level layer 53 covers the lower level layer 52, the upper level layer 53 has a wider dimension, and hence a resolution defect thereat.

SUMMARY OF THE INVENTION

An object of the present invention is to provide a charged particle beam exposure method wherein a compensation of proximity effect is performed accurately and at high speed even when there exists a lower level pattern layer which influences a backward scattering intensity.

According to one aspect of the present invention, there is provided a charged particle beam exposure method for exposing a pattern using charged particle beam, comprising the steps of dividing data of a pattern to be exposed on a surface layer of a substrate into those of small regions of a predetermined dimension, calculating areal density of the pattern within each divided small region, dividing data of a pattern of a lower level into those of small regions of a pre-determined dimension when the lower level pattern is already formed beneath the surface layer, calculating areal density of the lower level pattern within each divided small region, calculating a main exposure intensity for irradiating a pattern on the surface layer for each small region on a basis of total scattering intensity depending on the areal density of the pattern on the surface layer and the areal density of the pattern on the lower level layer, and exposing each small region of the surface layer based on the calculated main exposure intensity.

The surface layer and the lower level layer are preferably divided into small regions with a common mesh of division.

A total backward scattering intensity is preferably calculated by sampling those patterns on the lower level layer which is present in the same small region where there is a main exposure pattern.

According to another aspect of the present invention, there is provided a charged particle beam exposure device for exposing a pattern using charged particle beam, comprising first dividing means for dividing exposure pattern data to be exposed on a surface layer of a substrate into pre-determined small regions, first calculating means for calculating an areal density of the pattern within each said small region, second dividing means for dividing pattern data on the lower level layer into pre-determined small regions when a lower level pattern is already formed beneath the surface layer, second calculating means for calculating an areal density of a lower level pattern within each said small region, main exposure intensity calculating means for calculating a main exposure intensity for the exposure pattern on a basis of total scattering intensity depending on the areal density of the exposure pattern calculated by the first calculating means and the areal density of the pattern on the lower level layer calculated by the second calculating means, and irradiating means for exposing the pattern data in each said small region of the surface layer based on the calculated main exposure intensity.

According to an exposure method as described above, after a main exposure intensity for exposure pattern on a surface layer at each small region is calculated on a basis of a total scattering intensity depending on an areal density of the pattern on the surface layer and an areal density of the pattern on the lower level layer, so that each of the small regions on the surface layer can be exposed by the calculated main exposure intensity. In imprinting a surface layer pattern on a semiconductor substrate having a complicated lower level pattern, influence from lower level pattern which easily influence a backward scattering intensity can be taken into account in a simple manner. Consequently, compensation of proximity effect can be performed more accurately and with a higher speed. It can contribute to manufacture a semiconductor device with a high reliability.

When the surface layer and the lower level pattern are divided into small regions using a common dividing mesh, no extra compensation treatment, or the like, accompanying a change of dividing mesh for each of the surface layer pattern and the lower level pattern is needed. An effective compensation treatment can be performed for proximity effect.

When a total backward scattering intensity is calculated through sampling only a lower level pattern which is present within the same region where a main pattern is present, only those lower level patterns in the portion where the upper and lower level patterns overlap, which have a remarkable influence on the backward scattering intensity may be sampled and calculated. An effective compensation of proximity effect can be performed.

Even though a lower level pattern layer which influences a backward scattering intensity is formed, compensation of proximity effect can be performed accurately and with a high speed.

BRIEF DESCRIPTION OF THE DRAWINGS

FIGS. 7A to 7D are diagrams showing compensation of proximity effect according to prior art technique, wherein

DESCRIPTION OF THE PREFERRED EMBODIMENTS

For exposuring a resist film in a desired pattern, energy which electron beam gives to the resist film should be equal to or more than a certain threshold value within the pattern, and should be less than the threshold value with an operation margin outside of the pattern.

When an electron is incident on a specimen or a resist film, an energy that the electron gives to the resist film can be represented by an equation, with a dosage of the electron denoted by Q, $$E=Q\{\exp(-r^2/A^2)+B\exp(-r^2/C^2)\}.$$

Here, A denotes a parameter to express an extension of electron due to forward scattering, C denotes a parameter representing spreading of electron due to backward scattering, and B denotes a parameter expressing a ratio between forward scattering intensity and backward scattering intensity. Parameter A is determined by the resist film, while B and C change according to material of lower layer, substrate, or the like, as well as to the resist film.

Here, an amount or number of electrons incident on a unit area of the resist film is not uniform, but is proportional to an area of pattern within the unit area. Thus, the resist film is divided into a multiplicity of small regions and an areal density of pattern within each of the small regions is considered.

Figure 11:
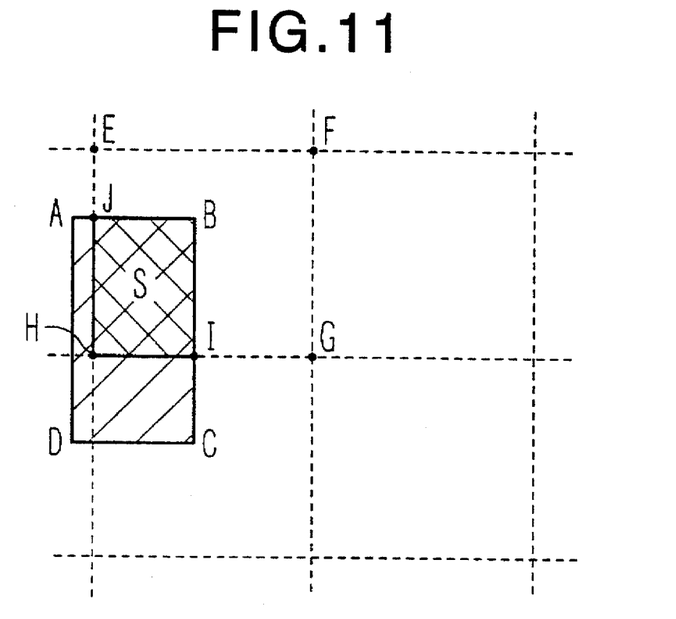
FIG. 11 is a diagram showing a manner of division of exposure pattern on a resist film into small regions.

As shown in FIG. 11, the resist film is divided into a multiplicity of small unit regions. A rectangle EFGH denotes a small unit region. A rectangle ABCD is a pattern to be exposed. A portion of the pattern ABCD which is included in the small region EFGH is denoted by a rectangle JBIH.

A areal density $\eta$ of the pattern within the small region EFGH is represented by a formula:

$$\eta=(\text{area of JBIH})/(\text{area of EFGH}).$$

Figure 12A:
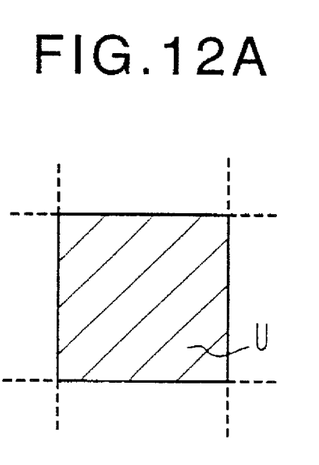
FIGS. 12A and 12B are diagrams showing examples of exposure pattern.

As shown in FIG. 12A, when a pattern U which occupy all the area of small unit region for calculating areal density is exposured, an energy intensity E of exposure will be expressed by a formula:

$$E=\int dS\{\exp(-r^2/A^2)+B\exp(-r^2/C^2)\}\cdot Q_o \qquad (2)$$

Here, $Q_o$ denotes an amount of exposure wherein the resist film is patterned at a pre-determined film leaving proportion, and dS means that the integral is operated over the whole area of the small region. If the small region is set to be sufficiently larger than the parameter A, C, the integral of the formula (2) can be substituted by an integral over a range of 0 to $\infty$, and yields, $$E=2\pi Q_o\{A^2+BC^2\} \qquad (3)$$

Figure 12B:
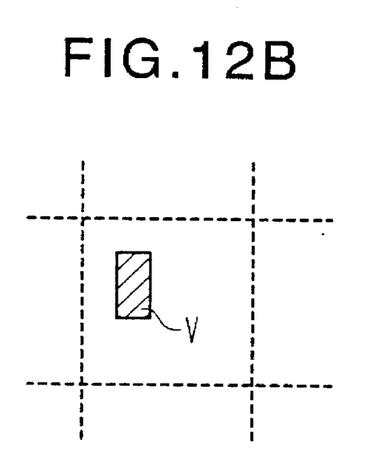

Next, a case as shown in FIG. 12B is considered. A pattern V occupies only a portion of the small region. Since the pattern V of FIG. 12B must have the same intensity of energy E as the pattern U of FIG. 12A, an amount of exposure Q' given to the pattern is expressed as, $$E=\int dS'\{\exp(-r^2/A^2)+B\exp(-r^2/C^2)\}\cdot Q',$$

where dS' means an integral over a region of pattern V of FIG. 12B. Premising that a dimension of the pattern V is sufficiently larger than the parameter A which normally takes a value of approximately 0.1 μm–0.2 μm, the above equation becomes:

$$E=2\pi Q'\{A^2+(S'/S_o)BC^2\} \qquad (4)$$

where, S' expresses an area of the pattern V, and $S_o$ is an area of the pattern U which corresponds to the area of the small region. The term $S'/S_o$ is the areal density $\eta$ of the pattern as described above. The width of each small pattern may be at least equal to 5A. The area of each small region may be set in the range of ¼–100 μm².

From equations (3) and (4), the amount of exposure of the pattern V as shown in FIG. 12B can be determined by:

$$Q'=[(A^2+BC^2)/(A^2+BC^2)]\cdot Q_o$$

The above calculation is performed to each small region and each unit small region is exposed with an amount of exposure thus calculated.

Here, the approximation of the equation (2) by the equation (3) uses conditions that A is sufficiently small and the term $\exp(-r^2/A^2)$ damps very rapidly, and that C is almost of the same size as the small region and is constant within the small region. From these conditions, following equation can be obtained;

$$\int ds \text{ (in region of pattern)} \cdot \exp(-r^2/A^2)$$
$$\simeq \int ds \text{ (from 0 to } \infty) \exp(-r^2/A^2)$$
$$\simeq 2\pi A^2,$$

and $$B \cdot \int ds \text{ (region of pattern)} \cdot \exp(-r^2/C^2)$$
$$\simeq \text{(area of a pattern)/(area of a small region)}$$
$$\times ds \text{ (from 0 to } \infty) \exp(-r^2/C^2)$$
$$\simeq 2\pi B \cdot C^2 \cdot \eta$$

The above analysis has been made on a case wherein a resist film is applied on lower level layers formed of uniform materials and patterned.

Next, a case of patterning a specimen which is already provided with lower level layers of varied materials will be described.

When a lower level pattern, especially of a material with a large mass number as W, is present beneath a region to be exposed, an intensity of backward scattering increases. Thus, when a portion with a lower level pattern and a portion without a lower level pattern are exposed with the same intensity of exposure, the portion with a lower level pattern will be given a larger energy. A method of exposure for obtaining a pattern with a high accuracy by exposing each small region with a uniform intensity will be described hereinunder.

Figure 1:
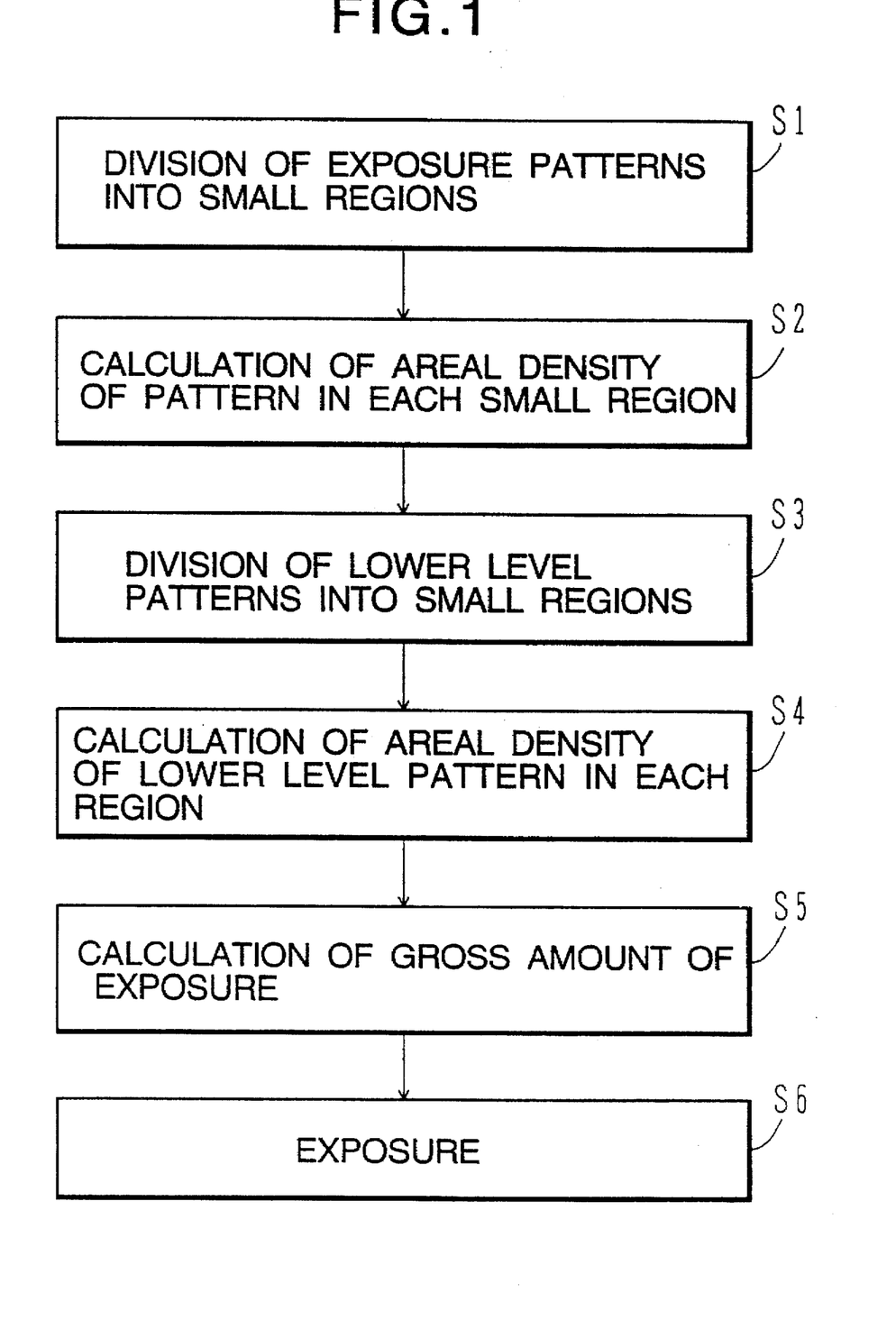
FIG. 1 is a flow chart for illustrating an exposure method of charged particle beam according to an embodiment of the present invention.

FIG. 1 is a flow chart showing respective steps of an exposure process. A semiconductor substrate as shown in FIGS. 2A and 2B is considered as an object to be exposed.

Figure 2A:
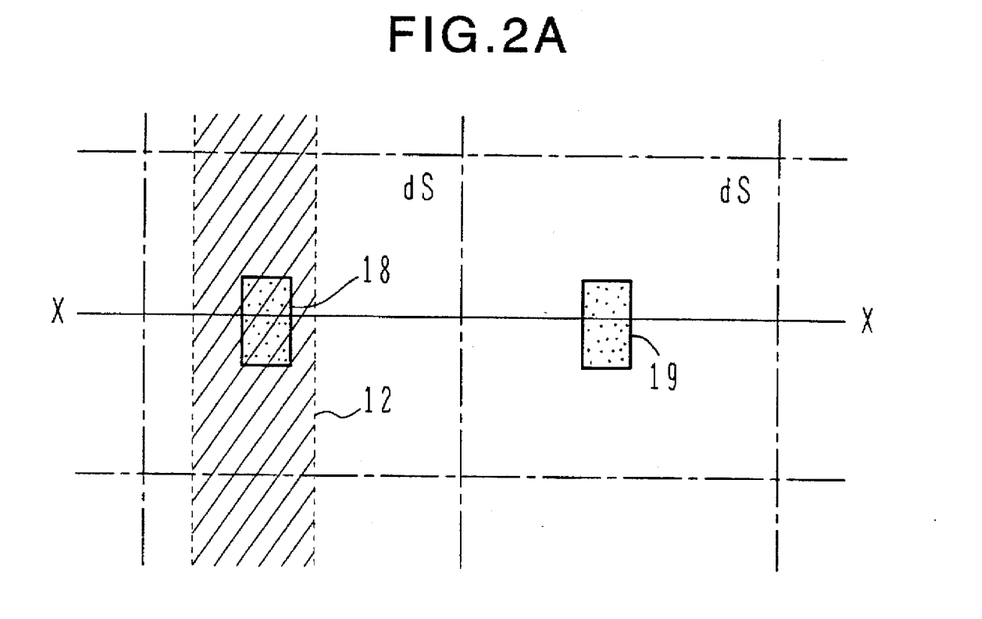
FIGS. 2A and 2B are a top view and a sectional view of a wafer in a step of exposing a resist film.
Figure 2B:
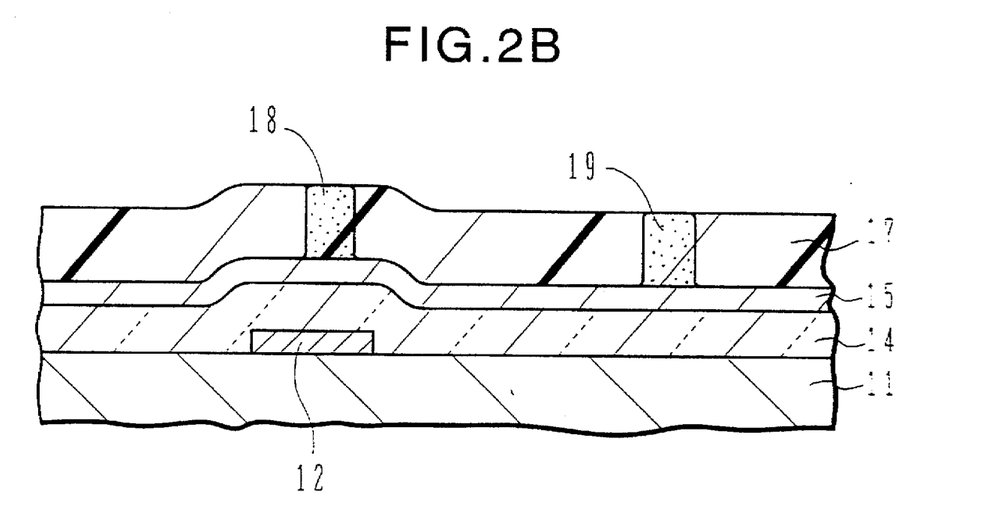

FIGS. 2A and 2B show a partial top view and a partial sectional view of a semiconductor wafer applied with a resist film. FIG. 2B is a sectional view along a line X-X' of FIG. 2A.

On an Si substrate 11, a striped wiring layer 12 of W is formed. On the striped wiring layer 12, an inter-layer insulating film 14 of $SiO_2$ is formed and a layer 15 of Al to be processed is formed thereon. On the layer 15 to be processed, a resist film 17 is applied. Regions 18 and 19 within the resist film 17 are to be exposured. The region 18 is disposed on the lower level wiring layer 12.

The substrate 11, the inter-layer insulating film 14, the layer 15 to be processed, and the resist film 17 are present over the whole area of exposure so that they would afford a uniform exposure characteristics. The lower level wiring layer, however, intensifies partly a backward scattering intensity. If the regions 18 and 19 are exposed with the same amount of exposure, the region 18 will have a larger size than the region 19. Then, an effect of backward scattering caused by the lower level pattern is taken into account. At an interface between a lower level layer with the resist film, a backward scattering intensity of charged particles incident on a point of the resist film can be divided into two parts. A first backward scattering intensity is derived from a backward scattering by the layer 15 to be processed, and is expressed as a function of a distance R from an incident point of charged particles in a transverse direction by:

$$B_1 \cdot \exp(-R^2/C_1^2).$$

A second backward scattering intensity is derived from a phenomenon that charged particles incident down onto the lower level layer 12 are backward scattered and re-incident on the resist film 17 from downward to exposure the resist film 17 and is expressed by:

$$B_2 \cdot \exp(-R^2/C_2^2),$$

where parameters of $B_1$, $B_2$, $C_1$, and $C_2$ are determined by a wafer structure comprising the lower level wiring layer and the resist film, and an accelerating voltage of the incident electron beam. The parameters are physical quantities principally determinable experimentally or by numerical calculation using a Monte-Carlo method.

Figure 3A:
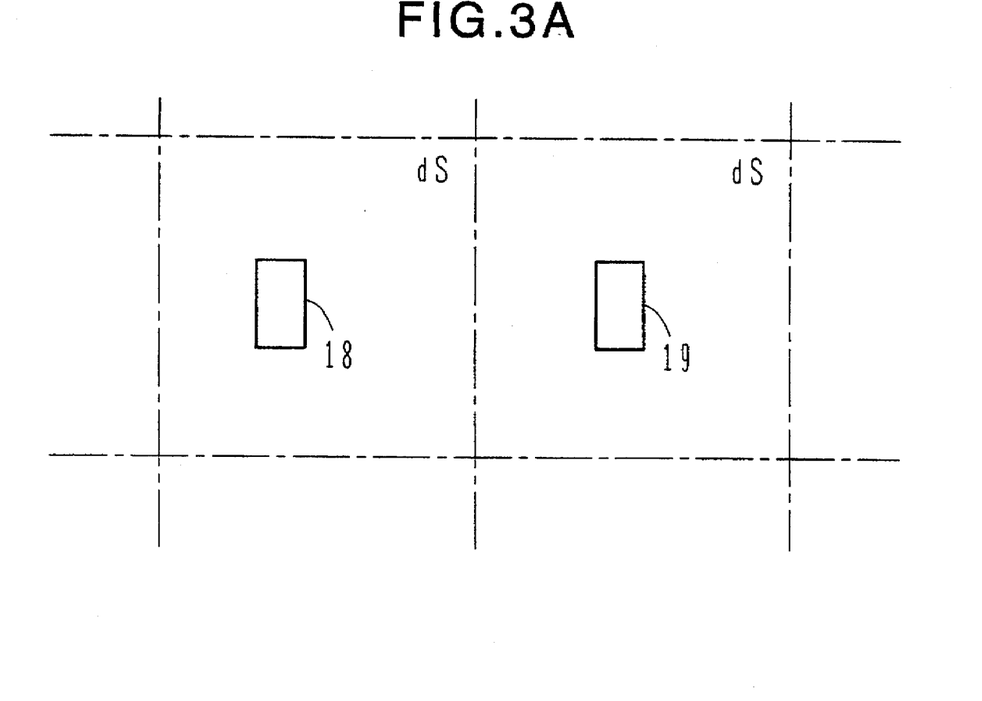
FIGS. 3A and 3B show a division of a pattern to small regions and a map of areal density of pattern within each small region.

Firstly, according to step S1 of FIG. 1, as shown in FIG. 3A, a subject pattern to be imprinted on the resist film 17 is divided into small regions dS of, for example, a few μm square.

Figure 3B:
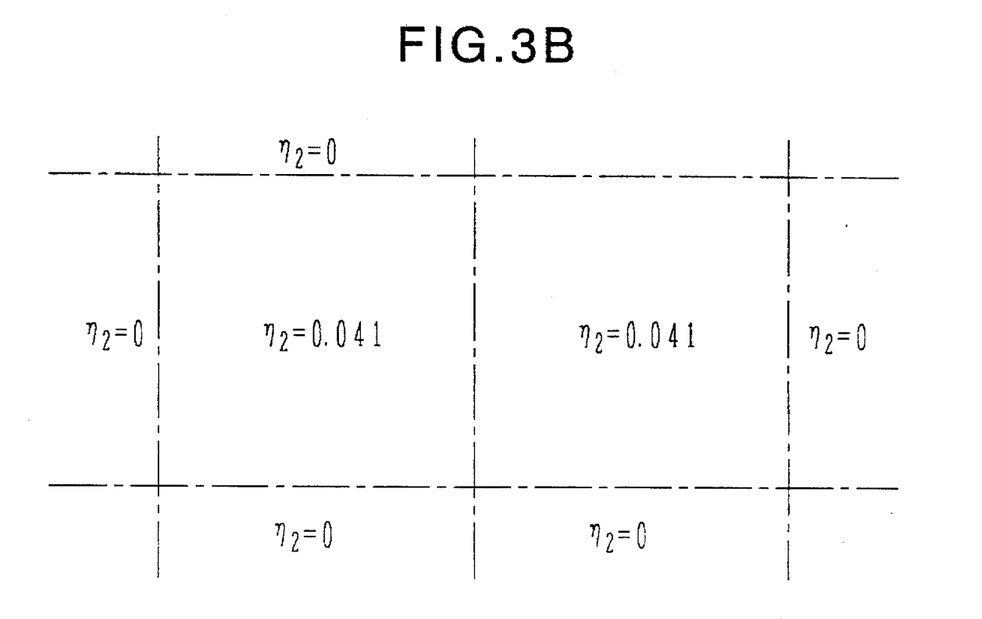

Next, according to step S2 of FIG. 1, an area of the pattern disposed in each of the small region is sought, and a ratio of its area with respect to the area of the small region or an areal density $\eta_2$ of the pattern is calculated. Using the pattern areal density $\eta_2$, a map as shown in FIG. 3B is formed.

Figure 4A:
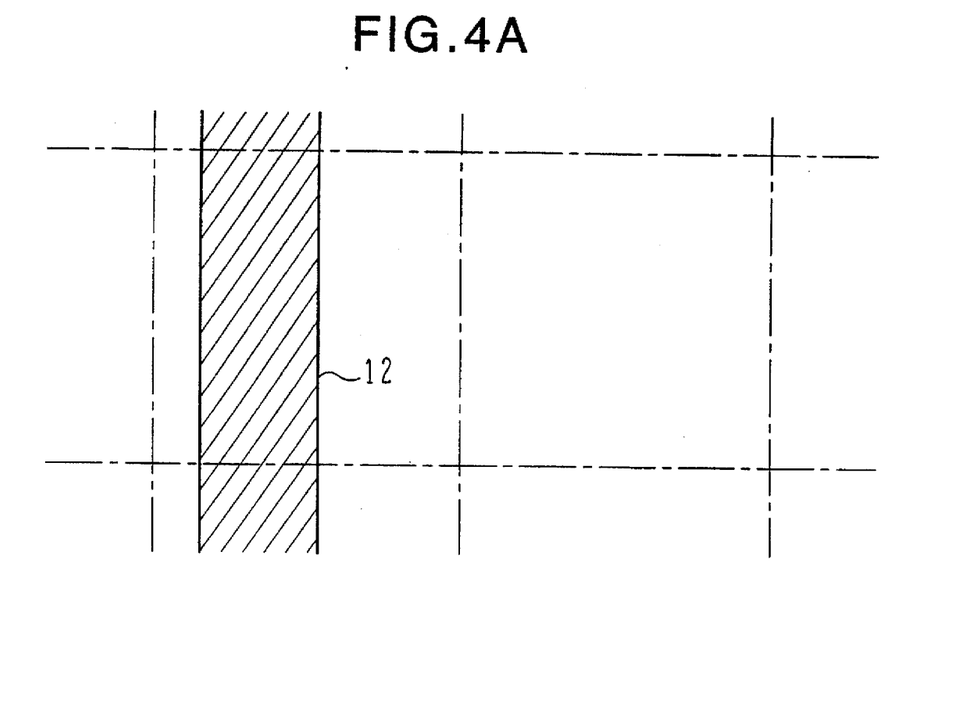
FIGS. 4A and 4B show a division of a lower level pattern to small regions and a map of areal density of pattern within each small region of lower level pattern.
Figure 4B:
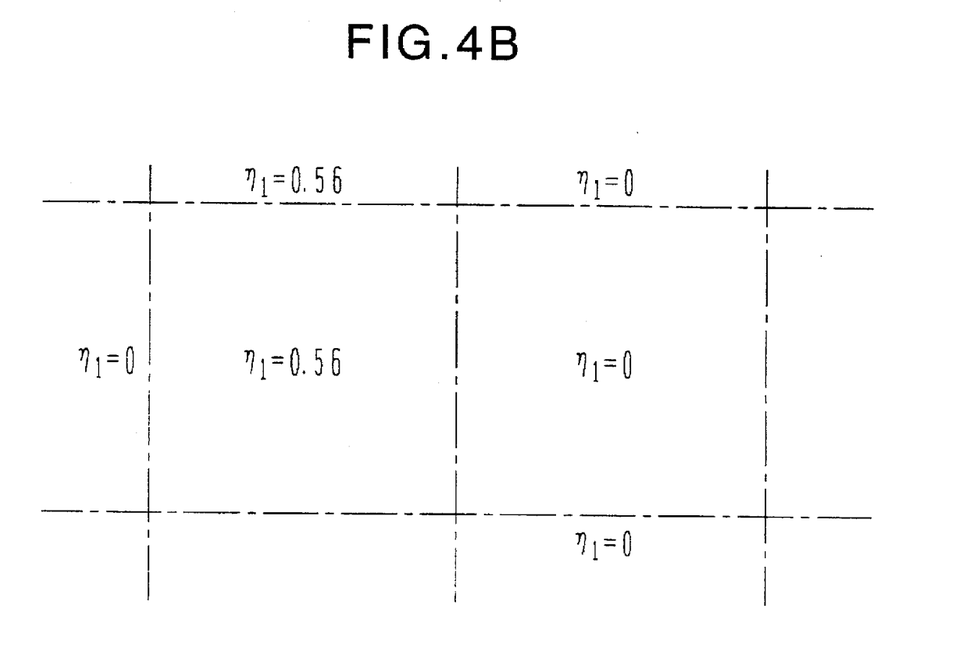

Next, according to step S3 of FIG. 1, a pattern present in the lower level layer (or the wiring layer of W), as shown in FIG. 4A is also divided into small regions. Then, according to step S4 of FIG. 1, a lower pattern areal density of $\eta_1$ is calculated to form a map of areal density, as shown in FIG. 4B. The map of areal density is not necessary to be formed on the basis of all of the lower level patterns. For example, patterns of thin silicon oxide layer which do not contribute much on the backward scattering of the electron can be neglected.

Then, according to step S5 of FIG. 1, an amount of main exposure is calculated. The exposure intensity of resist film as expressed by the formula (3) changes according to presence of the lower level pattern. Thus, parameters corresponding to portions provided with the lower level pattern are denoted by $B_1$ and $C_1$, and parameters corresponding to portions not provided with the lower level pattern are denoted by $B_o$ and $C_o$. An energy intensity corresponding to equation (3) is expressed as:

$$E \cong 2\pi Q\{A^2 + [\eta_1 \cdot B_1 C_1^2 + (1-\eta_1) \cdot B_o C_o^2]\} \quad (5).$$

Here, $\eta_1$ is a ratio of presence of the lower level pattern occupying a small region which is a probability of presence or areal density of the lower level pattern. Since the equation (5) is an energy intensity when the whole of a small region is exposured, an equation corresponding to the equation (4) for a case of imprinting a pattern with a pattern areal density $\eta_2$ is expressed by:

$$E \cong Q'\{A^2 + \eta_2[\eta_1 \cdot C_1^2 + (-\eta_1) \cdot B_o C_o^2]\} \quad (6).$$

In equation (6), a term which varies with the presence of a lower level pattern is a backward scattering term which is the second term in the parenthesis on the right hand side.

Figure 5:
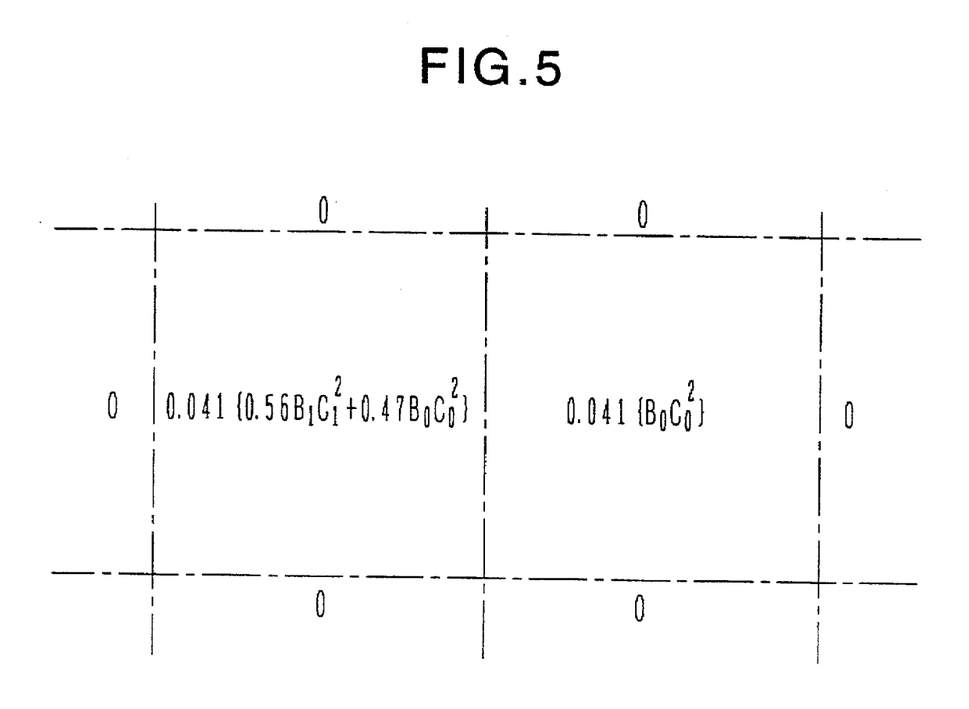
FIG. 5 shows a map of total backward scattering intensity obtained on the basis of maps of areal density of pattern data on a lower level layer and on a subject pattern layer.

FIG. 5 shows a backward scattering intensity map obtained by using an areal density maps of pattern data on a lower level wiring layer and on a subject pattern. A calculation for obtaining the map is worked on FIG. 3A, 3B, 4A, and 4B, and terms of the equation (6) which represent the backward scattering.

A total exposure intensity can be obtained by adding simply a forward scattering intensity $A^2$. Based on this intensity, an exposure amount for each small region is derived.

Each small region is exposed with the exposure amount thus determined (step S6).

When a reference amount of exposure is taken at a case with the strongest exposure intensity which corresponds to a case having a lower level pattern over the whole area of a small region with $\eta_1 = 1$ and having also a subject pattern with an area equal to that of a small region with $\eta_2 = 1$, the equation (5) becomes:

$$E = 2\pi Q\{A^2 + B_1 C_1^2\} \quad (7)$$

An exposure amount for a case with a pattern areal density $\eta_1$ of the lower level pattern and a pattern areal density of $\eta_2$ for the exposure pattern is calculated as:

$$Q' = [[(A^2 + B_1 C_1^2)/[A^2 + \eta_2\{\eta_1 \cdot B_1 C_1^2 + (1-\eta_1) \cdot B_o C_o^2\}]] \cdot Q \quad (8)$$

When the above equation is further generalized to a case in which there are already formed several lower level layers, the equation is expressed as:

$$Q''' = [\{A^2 + Bmax \cdot C^2 max/ \quad (9)$$

$$[A^2 + \eta\{\eta_1 \cdot B_1 C_1^2 + \eta_2 \cdot B_2 C_2^2 \ldots +$$

$$(1 - \eta_1 - \ldots - \eta_{N-1}) \cdot B_N C_N^2\}]] \cdot Q$$

where Bmax and Cmax are parameters of the superposed layers of maximal intensity of backward scattering among all combinations of existing layers. In the above equation, a summation over N means to sum every contribution from backward scattering intensity for each combination of layers present as lower level layers. For example, a case where there exist two layers, layer A and layer B, to sum contribution from three combinations, layer A only, layer B only, and superposed layers A and B.

Here, a division of lower level pattern and a division of subject pattern, typically, is performed on identical basis, and small regions of both patterns are superposed to each other.

However, both small regions may not necessarily be identical. For example, the subject pattern can be divided into smaller regions than the lower level pattern. In such a case, data for a small region of a lower level pattern can be used in common to a plurality of small regions of subject pattern.

Identical mesh of division may be employed for the subject pattern and the lower level pattern, and be disposed with a shift of half pitch of a small region. Namely, on each corner of a small region of subject pattern, a center of a small region of a lower level pattern is disposed. In this case, an amount of exposure is determined considering a wider region of lower level pattern overlapping the subject pattern.

Here, after an exposure of the resist film in the way as described above, development of the resist film and a processing of the layer to be processed is performed according to usual processes.

The present invention has been described above in relation to preferred embodiments. The present invention is not limited to what has been described in connection with these embodiments. For example, it will be apparent to those skilled in arts that various changes, substitutes, combinations and improvements can be made within the scope and spirit of the appended claims.

I claim:

1. A charged particle beam exposure method for exposing a pattern with a charged particle beam, comprising the steps of:

dividing data of a pattern to be exposed on a surface layer of a substrate into small regions of a predetermined dimension;

calculating area density of the pattern within each divided small region;

dividing data of a pattern of a lower level structure into small regions of a predetermined dimension, the lower level pattern being formed within the substrate having the surface layer which is to be patterned;

calculating area density of the lower level pattern within each divided small region;

calculating a main exposure intensity for irradiating a pattern on the surface layer for each small region based on total scattering intensity depending on the area density of the pattern on the surface layer and the area density of the pattern on the lower level layer; and exposing each small region of the surface layer with a charged particle beam based on the calculated main exposure intensity for the charged particle beam.

2. A charged particle beam exposure method according to claim 1, wherein the width of said small pattern is at least equal to 5 A when forward scattering of charged particle beam is approximated by $\exp(-r^2/A^2)$ where r is a distance from the point of incidence and A is a coefficient.

3. A charged particle beam exposure method according to claim 1, wherein the surface layer and the lower level layer are divided into small regions at a mesh common to both surface layer and lower level layer.

4. A charged particle beam exposure method according to claim 1, wherein a total backward scattering intensity is calculated by sampling patterns on the lower level layer which are present in the same small region where there is a main exposure pattern.

* * * * *